United States Patent [19]

Ohta

[11] Patent Number: 4,945,392
[45] Date of Patent: Jul. 31, 1990

[54] STATIC INDUCTION TRANSISTOR AND MANUFACTURING METHOD OF THE SAME

[75] Inventor: Yoshinori Ohta, Ina, Japan
[73] Assignee: Olympus Optical Co., Ltd., Tokyo, Japan
[21] Appl. No.: 177,278
[22] Filed: Apr. 4, 1988

[30] Foreign Application Priority Data

Apr. 28, 1987 [JP] Japan ................. 62-103134

[51] Int. Cl.$^5$ ............................. H01L 29/80
[52] U.S. Cl. ........................ 357/22; 357/30; 357/52
[58] Field of Search ............ 357/52, 22 B, 22 C, 357/22 F, 22 G, 30

[56] References Cited

U.S. PATENT DOCUMENTS

| | | | |
|---|---|---|---|
| 3,772,576 | 11/1973 | Nienhuis et al. | 357/52 |
| 4,412,238 | 10/1983 | Khadder et al. | 357/22 G |
| 4,456,918 | 6/1984 | Beasom | 357/22 G |
| 4,470,059 | 9/1984 | Nishizawa et al. | 357/22 C |
| 4,485,392 | 11/1984 | Singer | 357/22 F |
| 4,496,963 | 1/1985 | Dunkley et al. | 357/22 G |
| 4,499,483 | 2/1985 | Yamazaki et al. | 357/52 |
| 4,504,847 | 3/1985 | Nishizawa | 357/22 R |
| 4,608,582 | 8/1986 | Nishizawa | 357/22 C |
| 4,626,884 | 12/1986 | Shannon | 357/30 |
| 4,725,873 | 2/1988 | Nishizawa et al. | 357/22 B |

*Primary Examiner*—Rolf Hille
*Assistant Examiner*—Steven Loke
*Attorney, Agent, or Firm*—Armstrong, Nikaido, Marmelstein, Kubovcik & Murray

[57] ABSTRACT

A static induction transistor has in a surface region of a first type of high-resistance semiconductor, a source region formed by a first type of diffusion layer and a gate region which surrounds the source region from at least two directions and which is formed by a second type of diffusion layer which is diffused deeper than the layer of the source region. The static induction transistor also has a first or second type of impurity layer formed immediately beneath the source region. A second type of impurity layer is further formed in the surface region of the first type of high-resistance semiconductor outside of the gate region. Furthermore, a first type of impurity layer is formed in the surface region of the first type of high-resistance semiconductor, or a first or a second type of impurity layer is formed in the surface region of the first type of high-resistance semiconductor between the source region and the gate region at the same depth as or shallower than the source region. As a result, the pinch-off voltage of the transistor can be easily controlled. Furthermore, photoelectric charge generated adjacent to the surface is immediately captured in the gate region without any loss, whereby generation of residual images can be prevented. Furthermore, extension of a depletion layer can be restricted as far as possible, whereby a thermally excited charge generated in the depletion layer can be reduced, causing dark currents to be restricted. Consequently, the S-N ratio can be improved.

21 Claims, 15 Drawing Sheets

STATIC INDUCTION TRANSISTOR AND MANUFACTURING METHOD OF THE SAME

BACKGROUND OF THE INVENTION

Field of the Invention

This invention relates to a high S-N Ratio static induction transistor and a method of manufacturing the same, The static induction transistor is able to optionally control the pinch-off voltage thereof and capture photoelectric charge without involving any loss.

A static induction transistor (abbreviated as "SIT" hereinafter) works on a principle which is different from that of the conventional bipolar transistor, junction FET, and MOSFET. That is, SITs are provided with a potential barrier in a depleted channel region thereof between the source and drain which are disposed in a semiconductor. The potential barrier is able to be controlled by a gate voltage and a drain voltage. The height of the potential barrier is varied by the gate voltage or the drain voltage so that a current passing between the source and the drain is controlled.

In the SIT, the charge from the source is injected into the channel region after it has cleared the potential barrier, and it reaches the drain while being accelerated in the depleted electric field. Therefore, the charge runs through the channel at the saturation speed of the charge (in a case of an electron, it is $8 \times 10^6$ cm/s). Since a high-resistance semiconductor substrate is used for the purpose of depleting the inside of the channel, in addition to a fact that the SIT has a small junction capacitance, SITs are, in principle, suitable for use in high-speed operations. Furthermore, SITs are characterized in being free from charge diffusion, and in having a low noise level because of the high running speed of its charge.

By using a pin diode as a photoreceiving element, a photodiode exhibiting high photoelectric charge yield can be obtained, utilizing the pin diode's characteristics of a large volume of the depleted layer being widened through the high-resistance semiconductor substrate. Because a SIT is an element that uses a high resistance substrate, a so-called photosensor of an internal amplifying type, in which both photoelectric conversion capability and amplifying capability can be achieved in one element, can be obtained by combining the pin diode built into the SIT and the amplifying capability of the SIT.

SIT photosensors can be applied to any application, whether single, line or area applications. They also display the original characteristics of SITs such as high speed and low noise. Furthermore, since one SIT can constitute a unit cell of a photosensor, such photosensors are suitable for use in a miniaturized manner. Furthermore, because of the low noise level of SIT photosensors, a high S-N ratio can be expected, and high sensitivity can be obtained due to the photoelectric conversion achieved by the use of a pin diode. Furthermore, since a photoelectric charge storage region and channel region are separated from each other by a pn junction, the photoelectric charge can be maintained even if the output is read out, whereby non-destructive readout can be conducted. As a result of this, it is anticipated that SIT photosensors will be utilized for photoelectric analog memories.

An operation of SITs when using it as a photosensor will now be described.

FIG. 1 is a cross-sectional view of an SIT photosensor in the form of a single cell.

A high-resistance epitaxial layer 2 is grown on an n+ substrate 1 acting as the drain of the SIT so that a shallow n+ source 3 is formed. The shallow n+ source 3 is surrounded by a p+ gate region 4. A gate electrode 5 made of polysilicone, a high fusing point metal, silicide or the like is disposed above the p+ gate region 4, a thin oxidized film 6 being disposed therebetween, whereby a MOS capacitance 7 is formed. In order to electrically isolate the cells, an element-isolating region 8 is formed by means of an n+ diffused layer or a trench isolation method. Reference numeral 13 represents a thermal oxidized film, and reference numerals 14 and 15 represent $SiO^2$ films formed by way of a CVD.

Photoelectric conversion is carried out by the pin diode constituted by a p+ gate region 4, n− epitaxial layer 2, and an n+ substrate 1. The n substrate 1 generally has a positive voltage applied thereto so that the pin diode is reversely biased. As a result of this, a depletion layer 9 extending from the p+ gate region 4 is grown until it substantially reaches the overall width of the epitaxial layer 2, and it is then further widened in the lateral direction. When the photosensor is storing charge, a negative voltage is applied to the p+ gate region 4 through the MOS capacitance 7. An electron 10 of the electron hole pairs generated in the depletion layer 9 due to incidental light escapes into the drain 1 or the source 3, and a hole 11 is stored in the p+ gate region 4 so that the gate potential is raised. When the gate potential is thus raised, the potential barrier formed in a channel 12 formed by the depleted epitaxial layer 2 which is formed between the source 3 and the drain 1 is lowered, whereby the electrons 10 begin moving from the source 3 toward the drain 1.

The source 3 is grounded before the storage time period, and the potential of the p+ gate region 4 is forwardly biased with respect to the source 3 through the MOS capacitance 7, as a result of which the photoelectric charge stored in the p+ gate region 4 is delivered to the source 3 (reset state).

A sequential operation consisting of a reset, storage and readout is illustrated by the time chart shown in FIG. 2A. FIG. 2B shows the structure of a circuit in which an operation of a single cell is illustrated. Reference numeral 17 represents an SIT forming a cell, reference numeral 18 represents a switching transistor, and symbol $C_G$ represents a gate oxidized film capacitance. Symbol $\phi_G$ represents a pulse signal applied to the gate electrode of the SIT 17, and symbol $\phi_s$ represents a pulse signal applied to the switching transistor 18. When it is in a reset mode, potential $V_G$ in the p+ gate region 4 becomes built-in potential $\phi_B$, and is initialized as $$\left( \phi_B - \frac{C_G}{C_G + C_j} \cdot V_{RS} \right)$$

at a timing T, where symbol $C_J$ represents gate junction capacitance. Symbol $V_{RS}$ represents a drive pulse applied to the SIT gate electrode in a reset mode. Symbol $V_{RD}$ represents a drive pulse applied to the SIT gate electrode when it is in a readout mode. Symbol $V_G$ represents the level corresponding to the rise of gate potential brought about by the photo-generated hole.

During the storage period, the source 3 is put in a floating state.

When the gate potential is raised due to the incidence of light, and the potential barrier is lowered, causing electrons to move from the source 3 to the drain 1, the source potential is raised. As a result of this, the height of the potential barrier is again raised with respect to the potential of the source 3, and the flow of electrons is stopped. Therefore, the source potential is changed in accordance with the gate potential. The source potential can be read out any number of times without damaging the photo-generated hole stored in the gate region 4 (non-destructive readout). When it is in the readout mode, the difference between the source potential $V_s$ and the gate potential $V_G$ becomes, as shown in FIG. 3, the pinch-off voltage $V_p$ of the static characteristics of an SIT ($V_s=V_G-V_p$). The pinch-off voltage $V_p$ is defined as a voltage $V_{GS}$ between the gate and the source at which the source current $I_s$ begins flowing with the voltage $V_{DS}$ between the drain and the source remaining constant.

The pinch-off voltage $V_p$ serves an important role in setting the drive pulses $V_{RD}$ and $V_{RS}$ of the SIT photosensor. In the case of a linear sensor or an area sensor, the dispersion of the pinch-off voltage $V_p$ as it is corresponds to the dispersion of the output from the above sensors. The parameters for determining the pinch-off voltage $V_p$ are such as the density of the epitaxial layer, the depth $X_j$ of diffusion of the p+ gate region, the width Wg of the gate, and the depth of the source.

FIG. 4 is a vertical cross-sectional view illustrating the state after the diffusion of the gate region when the SIT is prepared. Symbol Wg represents the dimension of resist 22 provided on a thin thermally-oxidized film 21. The substantial width 2a ($2a=Wg-2\times0.8\times x_j$) which acts to determine the pinch-off voltage $V_p$ is provided by masking the resist 22, implanting ions of boron into the region 23 which is to be a p+-gate region, and obtaining a predetermined gate diffused depth $x_j$ after ion diffusion.

In FIG. 3, an SIT having $V_p>0$ is called a normally-off type, while one having $V_p<0$ is called a normally-on type. Symbol $\Phi_B$ represents a built-in voltage between the gate and the source. The reason that the source current $I_s$ rapidly increases when $V_{GS}>\Phi_B$ is because the p+ gate region 4 and the source 3 are forwardly biased. Assuming that the depth $x_j$ of diffusion in the p+ gate region is constant, the narrower the width Wg of the gate, the closer the pinch-off voltage $V_p$ moves to $\Phi_B$. That is, by changing the width Wg of the gate, the normally-on SIT or the normally-off SIT is gradually changed to a bipolar transistor. If the width Wg of the gate is decreased, the substantial distance between the p+-gate region 4 and the source 3 also decreases. Therefore, the voltage resistance $BV_{GS}$ between the gate and the source is lowered. As a result of this, the pinch-off voltage $V_p$ and the voltage resistance $BV_{GS}$ between the gate and the source are, as shown in FIG. 5, changed with respect to the width Wg of the gate. Therefore, a limitation is involved in that the pinch-off voltage $V_p$ and the voltage resistance $BV_{GS}$ between the gate and the source cannot be changed individually. Furthermore, a problem arises in that the manufacturing process must be changed in a major way, such as changes in the mask dimension or the depth $x_j$ of diffusion in the p+-gate if any means for changing the pinch-off voltage $V_p$ of the SIT is employed.

Next, the other problems concerning SIT photosensors will be described. SIT photosensors have a characteristic of good sensitivity for short waves. This characteristic is due to the fact that by widely forming a high-resistance epitaxial region through the cell which is formed by an SIT, holes generated in a depleted layer which extends laterally over the p+ gate region and those generated in the diffusion length of the holes can be effectively captured as a photoelectric charge signal. This state will now be described with reference to a plan pattern of a single cell of the SIT photosensor shown in FIG. 6. In this figure, reference numeral 31 represents an epitaxial region, and reference numeral 32 represents an isolating region. Reference numeral 33 represents a p+ gate region, and reference numeral 34 represents the end portion of the p+ gate region 33. Reference numeral 35 represents a source region, and reference numeral 36 represents a gate electrode for biasing the p+ gate region 33. Reference numeral 37 represents a source electrode, and reference numeral 38 represents a depletion layer extending from the p+ gate region 33 to the epitaxial region 31. The holes generated in this depletion layer 38 are instantaneously captured by the electric field of the depletion layer into the p+ gate region 33. However, a problem arises in that the holes generated in the epitaxial region 31 of the outer-side of the depletion layer 38 partially vanish during movement from the place at which the holes are generated to the end of the depletion layer 38 because these holes reach the depletion layer 38 due to diffusion. Another problem arises in that a residual image is generated because there is a charge left over after readout due to the movement caused by the diffusion.

Furthermore, even though an SIT photosensor can have a wide depletion layer 38 formed therein because the high resistance epitaxial region 31 thereof acts to receive light, a large problem arises from the dark current that is generated in the depletion layer 38. With regard to the charge that is generated in a depletion layer, a rather large charge is generally generated in a depletion layer which extends along a surface, as compared with that generated in a depletion layer which extends through a bulk. In the structure shown in FIG. 1 wherein a high resistance region covers the surface of the epitaxial region, since the extension of the depletion layer on the surface of the epitaxial region is large, a problem arises in that the amount of dark output becomes large, and the S-N ratio deteriorates in the reduced amount of light.

That is, the dark current generated in an SIT photosensor during a storage period becomes the total sum of charges generated in a depletion layer outward of the p+ gate region 4, in a depletion layer extending in the n− epitaxial layer 2 toward the drain 1, and in a depletion layer between the p+ gate region 4 and the source 3. As a result of this, this dark current is larger than that generated in the case of a simple pin diode. The thus-generated excessive dark output is assumed to be mainly due to the charge which is generated in the depletion layer between the p+ gate region 4 and the source 3. Since the distance between the p+ gate region 4 and the source 3 is relatively short, depletion can be readily realized only by a built-in voltage. Since the p+ gate region 4 and the source 3 are each high-density diffused layers (the surface density is substantially $10^{18}$ to $10^{20}$ cm$^{-3}$), the width of the depletion layer between them does not substantially change even if the region between the p+ gate region 4 and the source 3 is reversely biased during the storage period. On the other hand, the widths of the depletion layer extending outwardly from the p+ gate region 4, and of that extending from the p+ gate region 4 toward the drain 1 increase as the reverse-bias voltage between the p+ gate region 4 and the drain 1 increases. As can be clearly seen from this, the strongest electric field is formed in the depletion layer between the p+ gate region 4 and the source 3 of the depletion layers formed around the p+ gate region 4 during the storage period. That is, the rate of generation of charge is highest in the above depletion layer.

FIG. 7 illustrates the change of the structure when the normally-off SIT changes to the normally-on SIT by changing the width Wg of the gate. As can be clearly seen from this figure, the width t of a depletion layer between the p+ gate region 41 and the n+ source 42 increases as the structure changes from the normally-off type to the normally-on type. In FIG. 7, reference numeral 43 represents an epitaxial layer, and reference numeral 44 represents a depletion layer.

FIG. 8 shows the result of measurement of the gate-source reverse characteristic with respect to the change of the width Wg of the gate. As the width Wg of the gate increases, the voltage resistance increases. On the other hand, leak current (gate-source current) also increases. This measurement shows that the important factor in preventing the generation of the dark output is to restrict the generation of charge in the depletion layer 44 between the p+ gate region 41 and the source 42.

As described above, the conventional SIT used as the photosensor shown in FIG. 1 has the following problems: in order to control the SIT pinch-off voltage, it is necessary to change the density of the epitaxial layer, the width of the gate, the depth of the gate, or the depth of the source. If the density of the epitaxial layer is changed, this change affects the threshold voltage $V_T$ of the p-channel MOSFET which is formed on the same substrate. Furthermore, any such change in the width of the gate, the depth of the gate, or the depth of the source affects the voltage resistance between the gate and the source. This leads to the problem that one parameter for individually changing the pinch-off voltage is not present.

Furthermore, since only the photoelectric charge which has reached the depletion layer by the way of diffusion changes into a photoelectric charge signal, the photoelectric charge being generated on the outside of the depletion layer extending from the p+ gate region, a problem arises in that the photoelectric charge partially vanishes during diffusion. A still further problem arises from the fact that the photoelectric charge which does not reach the depletion layer appears as a residual image when the following readout is conducted.

Furthermore, as the pin diode acts to receive light, the region for capturing the photoelectric charge is arranged to be a wide region due to the fact that the depletion layer extends widely to the outside of the p+ gate region. However, a problem arises herein that great charges are generated in the depletion layer, especially where it extends to the surface, and this leads to deterioration of the S-N ratio.

A still further problem arises from the fact that since the region between the p+ gate and the source is depleted, and each diffusion layer of the gate and the source are disposed closely together, the electrical field in the depletion layer is strong. During storage, the region between the p+ gate and the source is reversely biased, causing the electric field to be increased. As a result of this, the charge which is generated in the depletion layer between the gate and the source increases, again causing the problem of deterioration of the S-N ratio.

SUMMARY OF THE INVENTION

An object of the present invention is therefore to overcome the above described problems experienced with a conventional SIT serving as a photosensor cell, and to provide an SIT in which the pinch-off voltage can be individually controlled without affecting the characteristics of the other SITs and MOSFETs which are respectively formed on the same substrate.

Another object of the present invention is to provide an SIT in which photoelectric charge which is generated in the epitaxial region can be captured as a photoelectric charge signal without any loss being involved, and in which generation of residual images can be prevented.

A still further object of the present invention is to provide an SIT in which the charge which is thermally generated in a depletion layer outwardly extending from the gate region and in a depletion layer between the gate and a source is lowered in order to improve the S-N ratio.

According to the present invention, in an SIT in which a first type of high-resistance semiconductor formed by an epitaxial layer has in a surface region thereof a source region formed by a first type of diffusion layer and a gate region which surrounds said source region from at least two directions and which is made of a second type of diffusion layer which is diffused at a depth deeper than that in the source region. The SIT is characterized in that a first type or a second type of impurity layer is formed immediately beneath the source region by implanting ions.

By forming an impurity layer by implanting ions of, for example, an n-type impurity in an n-channel SIT case, in the vicinity of a potential-saddle point which is formed immediately beneath the source region, the pinch-off voltage can be shifted to the normally-on type. On the other hand, by forming an impurity layer by implanting ions of a p-type impurity, the pinch-off voltage can be shifted to the normally-off type. That is, only by forming an impurity layer by implanting ions, an SIT having the optional pinch-off voltage can be easily obtained without any necessity of changing the other process-parameters. Furthermore, by increasing in the dose of the p-type impurity for the purpose of moving the pinch-off voltage to the normally-off type, a bipolar transistor can be obtained, and control of the $h_{FE}$ of a bipolar transistor can be conducted.

According to the present invention, an SIT having in a surface region of a first type of high-resistance semiconductor, which is formed by an epitaxial layer, a source region formed by a first type of diffusion layer, a gate region which surrounds the source region from at least two directions and which is formed by a second type of diffusion layer which is diffused at a depth deeper than that in the source region, the SIT is characterized in that a second type of impurity layer is formed in a surface region of the first type of high-resistance semiconductor outside of the gate region which is formed by the second type of diffusion layer.

That is, by forming on the surface of the epitaxial layer, outside the gate region, a low-density impurity layer of the same type as the gate region, electric field covering the surface area of the epitaxial layer can be formed, whereby photoelectric charge which is generated in the surface area can be immediately captured in the gate region without involving any loss, and generation of residual image can be prevented.

Furthermore, according to the present invention, an SIT having on the surface of a first type of high-resistance semiconductor, which is formed by an epitaxial layer, a source region formed by a first type of diffusion layer and a gate region which surrounds the source region from at least two direction and which is formed by a second type of diffusion layer which is diffused at a depth deeper than that in the source region, the SIT is characterized in that a first type of impurity layer is formed in the surface region of the first type of high-resistance semiconductor outside of the gate region which is formed by the second type of diffusion layer, or a first or second type of impurity layer is formed in the surface region of the first type of high-resistance semiconductor between the source region which is formed by the first type of diffusion layer and the gate region which is formed by the second type of diffusion layer, the first or second type of impurity layer being formed at the same depth as or shallower than the source region.

As described above, an impurity layer of the same type as that of the epitaxial layer is formed in the surface region of the epitaxial layer outside of the gate region, whereby the density at the surface of the epitaxial layer is increased. As a result of this, extension of the depletion layer extending outside the gate region can, be restricted as small as possible, whereby generation of thermally excited charge in the depletion layer can be prevented, and dark current can be restricted. As a result of this, the S-N ratio can be improved.

Furthermore, by forming a p-type or an n-type impurity layer at the same depth as or shallower than the source in the surface region of the epitaxial layer between the gate and the source, extension of the depletion layer in the surface region between the gate and the source can be limited at the lowest level, whereby genertion of the thermally excited charge in the depletion layer can be restricted. As a result of this, dark current can be restricted, and the S-N ratio can be improved.

DETAILED DESCRIPTION OF THE PREFERRED EMBODIMENTS

An embodiment of the present invention will now be described.

Figure 9A:
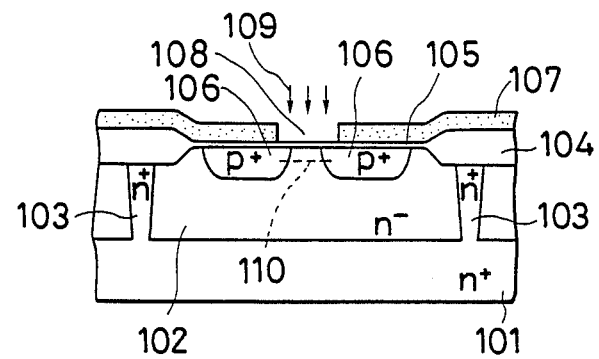
FIG. 9A illustrates a cross-sectional view of the SIT according to a first embodiment of the present invention during the manufacturing process.
Figure 9B:
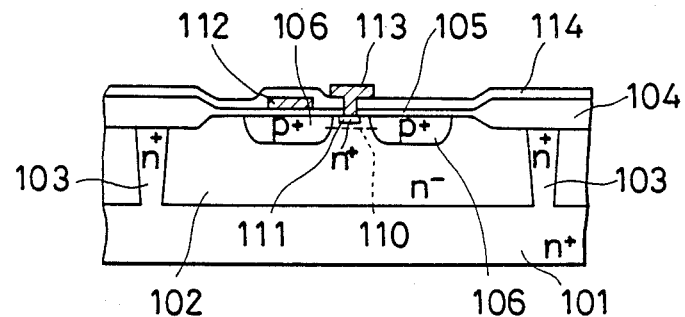
FIG. 9B illustrates in cross-section the structure of the completed SIT.

FIG. 9A illustrates in cross section the structure of a semiconductor device according to a first embodiment of the present invention, the semiconductor device being in the process of manufacture. In this embodiment, the structure is constituted to control a pinch-off voltage. Referring to the figure, reference numeral 101 represents an n+ substrate, reference numeral 102 represents n− epitaxial layer, and reference numeral 103 represents an isolating region. Reference numeral 104 represents a thick oxidized film, reference numeral 105 represents a thin oxidized film, and reference numeral 106 represents a p+ gate region. Reference numeral 107 represents a resist pattern in which a part of the inside of the p+ gate region 106 and a region 108 in which a source is to be disposed are exposed. Utilizing the resist pattern 107 as a mask, a p-type impurity such as boron or an n-type impurity such as arsenic or phosphorus is implanted at a depth close to the place at which the source diffusion layer will be disposed (in the vicinity of the saddle of the saddle-shaped potential of an SIT), the implanted impurity being an ion 109. As a result of this implantation, an ion-implanted layer 110 is formed. The type of impurity which is implanted is selected in accordance with the direction of the movement of the pinch-off voltage. That is, where the pinch-off voltage is moved toward the normally-on type, an n-type impurity is implanted, while where the pinch-off voltage is moved toward the normally-off type, a p-type impurity is implanted. The acceleration energy is determined in such a manner that the range is coincident with the saddle point, and the dose is set in accordance with the level of movement of the pinch-off voltage. After ions have been implanted, an oxidized film is formed in a similar manner to that for the conventional process, and the aperture forming for the source region is conducted to allow the source region to be formed. As a result of this, an SIT is obtained in which a p-type or an n-type impurity layer 110 is, as shown in FIG. 9B, disposed immediately beneath the source region 111. In FIG. 9B, reference numeral 112 represents a gate electrode, reference numeral 113 represents a source electrode, and reference numeral 114 represents an oxidized film.

This approach in which the movement of the pinch-off voltage of SITs is realized by implanting ions into a saddle point immediately beneath the source is convenient because SITs having various pinch-off voltages can be manufactured using the same mask and in the same manufacturing process. Furthermore, as the dose of the p-type impurity is increased, it becomes difficult for the p-type layer immediately beneath the source to become depleted by means of a drain voltage, as a result of which the SIT operation is transformed to a bipolar operation. That is, this invention can be applied to a case where it is intended that the pinch-off voltage of SITs is controlled, as well as to a case where it is intended that direct current amplification factor $h_{FE}$ is controlled. By changing the ion-implanting conditions while using the same mask, this invention can be applied not only to SITs but also to bipolar transistors.

Figure 10:
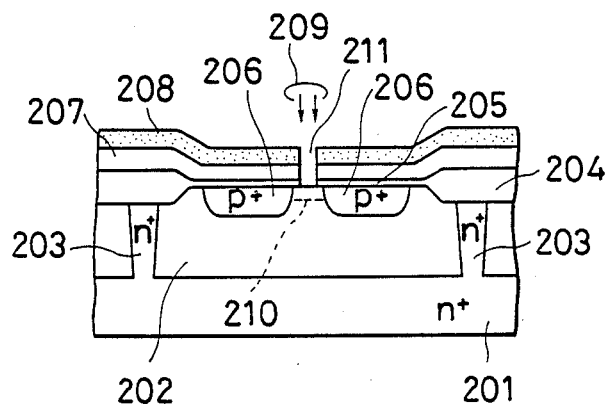
FIG. 10 illustrates a cross-sectional view of the SIT according to a second embodiment during the manufacturing process.

FIG. 10 illustrates in cross section the structure used in a manufacturing process according to a second embodiment of the present invention. This embodiment is characterized in that ion-implantation for the purpose of moving pinch-off voltage is conducted successively after the process of providing an aperture for forming the SIT source has been completed. Reference numeral 201 represents an n+ substrate, reference numeral 202 represents an n− epitaxial layer, and reference numeral 203 represents an isolating region. Reference numeral 204 represents a thick oxidized film, reference numeral 205 represents a thin oxidized film, and reference numeral 206 represents a p+ gate region. Reference numeral 207 represents an oxidized film, and reference numeral 208 represents a resist mask for conducting aperture provision for forming the source region 211. After etching the oxidized film 207 and thin oxidized film 205 by means of the resist mask 208, ions 209 are implanted with the resist mask 208 being retained for the purpose of forming an impurity ion-implanted layer 210 in the vicinity of the place at which the source will be formed. Such means for forming an impurity layer according to this embodiment has the advantage that one mask is used both for implanting the ion for the purpose of moving pinch-off voltage and for providing an aperture for forming the source.

Figure 11:
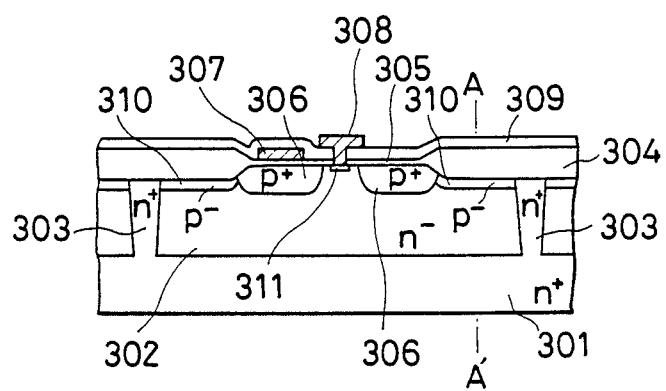
FIG. 11 illustrates a cross-sectional view according to a third embodiment.

FIG. 11 illustrates in cross section the structure according to a third embodiment. This embodiment is characterized in that in order to have the photoelectric charge which has been generated in the epitaxial layer 302 captured by the p+ gate region 306 without involving any loss, a low-density p-type diffusion layer 310 is formed over the surface of the n− epitaxial layer 302 in such a manner that the low-density p-type diffusion layer 310 is positioned in contact with the p+ gate region 306. Reference numeral 301 represents a n+ substrate, reference numeral 303 represents an isolating region, and reference numeral 304 represents a thick oxidized film. Reference numeral 305 represents a thin oxidized film, reference numeral 307 represents a gate electrode, and reference numeral 308 represents a source electrode. Reference numeral 309 represents an oxidized film, and reference numeral 311 represents a source region.

The surface density of the above p− diffusion layer 310 is set to a relatively low density in the range between $1 \times 10^{14}$ to $1 \times 10^{16}$ cm$^{-3}$.

Figure 1:
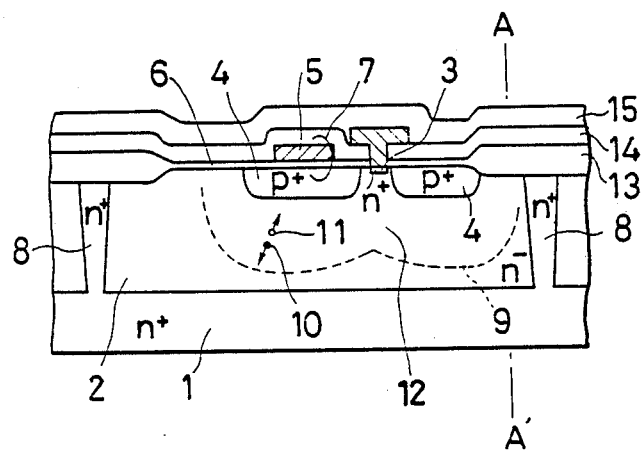
FIG. 1 shows a cross-sectional structure of a single cell of a conventional SIT photosensor.
Figure 2A:
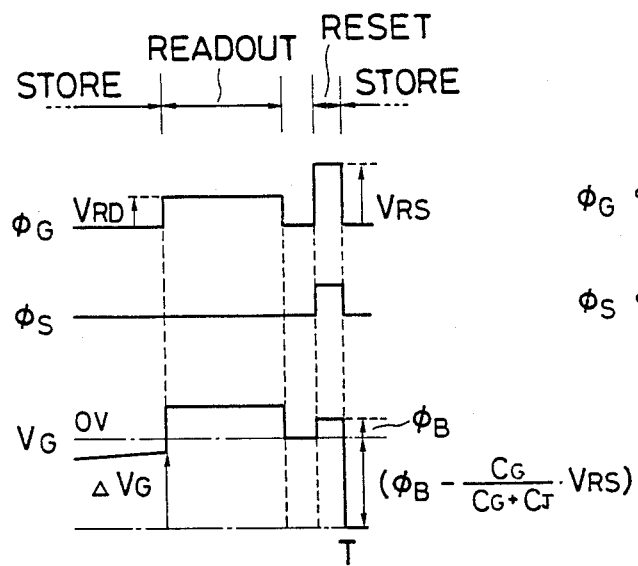
FIG. 2A is a time chart showing a drive pulse for a SIT photosensor and gate potential.
Figure 2B:
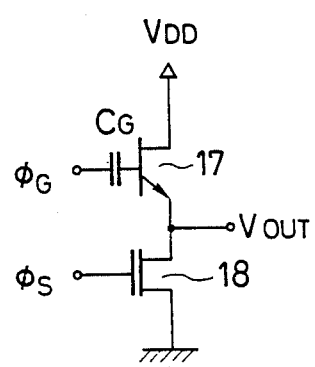
FIG. 2B shows a circuit to explain the operation of the SIT photosensor.
Figure 3:
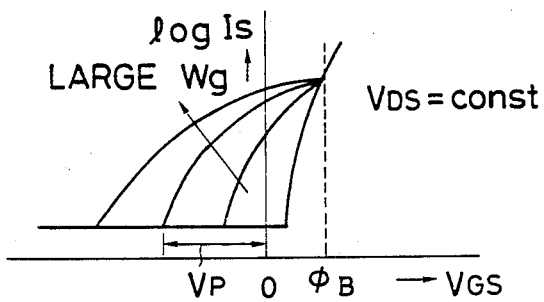
FIG. 3 illustrates the static characteristics of the SIT.
Figure 4:
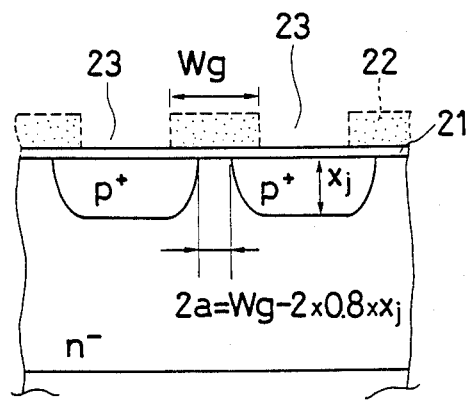
FIG. 4 illustrates the region in the vicinity of a source and a gate of the SIT.
Figure 5:
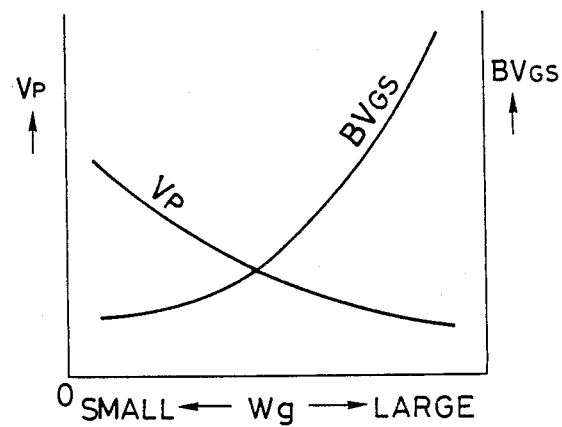
FIG. 5 illustrates the dependency of pinch-off voltage $V_p$ and the voltage resistance $BV_{GS}$ between the gate and the source on the width of the gate.
Figure 6:
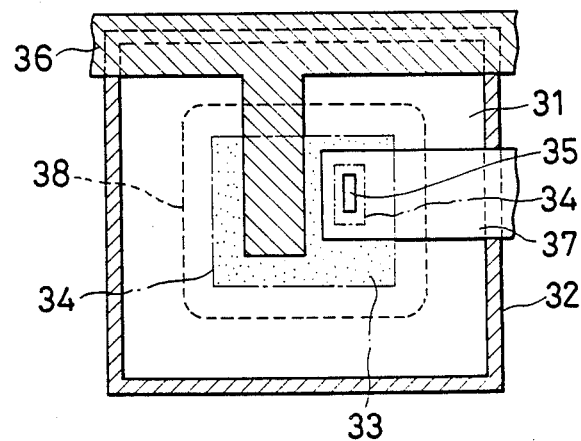
FIG. 6 illustrates the plan pattern of a single cell of the SIT photosensor.
Figure 7:
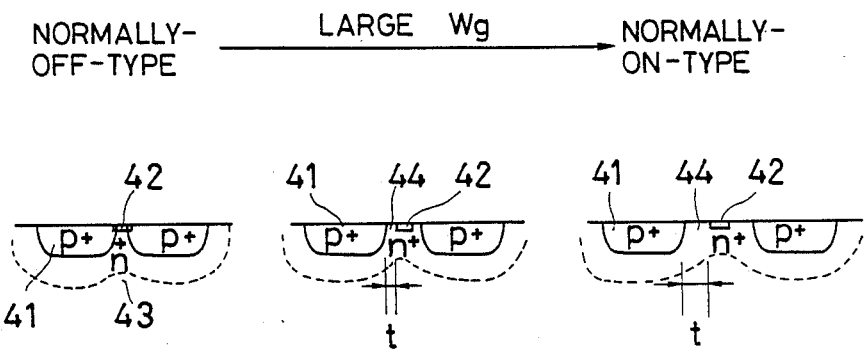
FIG. 7 illustrates the change in the structures of the gate and the source of the SIT.
Figure 12A:
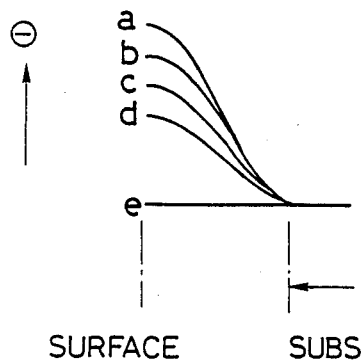
FIGS. 12A and 12B respectively illustrate potential distribution when no impurities exist in the surface region of an epitaxial layer and when impurities do exist in the same.
Figure 12B:
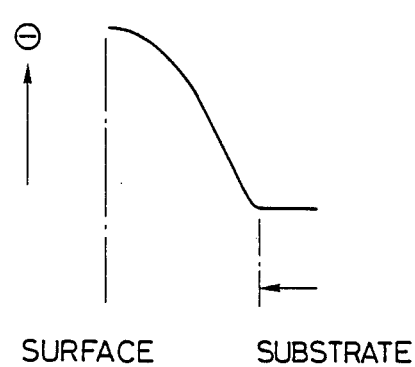

Potential distribution during a storage period in the cross sectional plane taken along the line A-A' is illustrated in FIGS. 12A and 12B which respectively show a case where a low-density p-type diffusion layer 310 is present in the surface region of n− epitaxial layer and a case where the same is not present. FIG. 12A illustrates the potential distribution in a case where no p-type diffusion layer 310 is present on the surface of the epitaxial layer, that is the potential distribution of the conventional structure shown in FIG. 1. A curve a shows the potential distribution in a case where the line A-A' crosses the p+ gate region 4. A curve e shows the potential distribution in a case where the line A-A' is positioned outward of the depletion layer 9 which extends from the p+ gate region 4. Curves b, c, and d show the potential distribution in the case where the line A-A' is positioned in the depletion layer 9 extending from the p+ gate region 4, the potential distribution shown by the curves b, c, and d being positioned away from the p+ gate region 4 in the alphabetical order of those curves. The region outward of the depletion layer 9 extending from the gate region 4 has no electric field. Therefore, the photo-generated holes 11 which have been generated in this region reach the end of the depletion layer 9 by way of diffusion, causing the photo-generated holes 11 to inevitably disappear in part. The probability that the photoelectric charge will vanish due to the recombination undertaken during diffusion is increased as the distance from the end of the depletion layer 9 is itself increased. Therefore, if a design in which the epitaxial region is widened is employed for the purpose of improving blue sensitivity, a problem arises in that the photoelectric charge is lost.

Meanwhile, as shown in FIG. 11, according to the present invention, in a case where a low-density p-type diffusion layer 310 is formed in the surface region of the epitaxial layer, the potential distribution becomes as shown in FIG. 12B. That is, since the p+ gate region 306 and the p-type diffusion layer 310 is electrically connected, an electric field accelerated with respect to the holes is formed toward the surface of the epitaxial layer regardless of the location of the line A-A'. The photo-generated holes are immediately captured in the p-type diffusion layer 310 by means of this accelerated electric field. Since the holes in the p-type diffusion layer 310 are of the majority carrier type, they have a long life. Therefore, the holes do not vanish even while they are being diffused from the p-type diffusion layer 310 to the p+ gate region 306, or while they drift and move through the electric field formed in the p-type diffusion layer 310.

The question as to whether the movement of the holes from the p-type diffusion layer 310 toward the p+ gate region 306 is carried out by means of diffusion or drift is determined in accordance with the density of the p-type diffusion layer 310. In a case where the density of the p-type diffusion layer is high, the p-type diffusion layer 310 is not depleted due to the reverse bias voltage between the p+ gate region 306 and the n+ substrate 301 and that between the p+ gate region 306 and the isolating region 303. Consequently movement by means of diffusion can be effected. On the other hand, in a case where the density of the p-type diffusion layer 310 is low, causing the p-type depletion layer 310 to be depleted due to the above reverse bias voltages, movement by means of drifting is performed. If the photogenerated holes are moved by drifting through the p-type diffusion layer 310, and are captured in the p+ gate region 306, no loss of photoelectric charge is involved.

In the embodiment shown in FIG. 11, the p-type diffusion layer 310 is formed in the surface region of the epitaxial layer. In such a structure, both the p+ gate region 306 and the p-type diffusion layer 310 are, in a reset mode, forwardly biased with respect to the grounded source 311. Therefore, all the holes captured in the p+ gate region 306 and p-type diffusion layer 310 are discharged to the source 311, and consequently no residual images is generated.

Figure 13A:
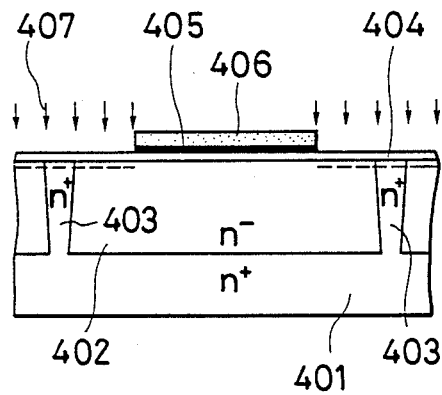
FIGS. 13A to 13D illustrate the manufacturing process according to the third embodiment shown in FIG. 11.
Figure 13B:
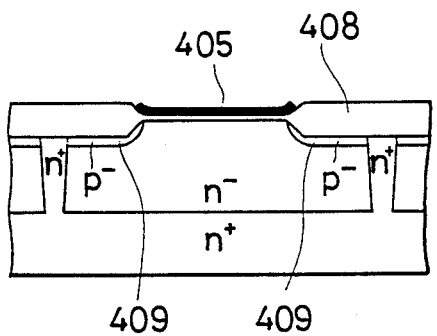
Figure 13C:
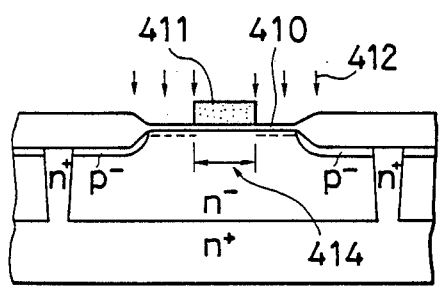
Figure 13D:
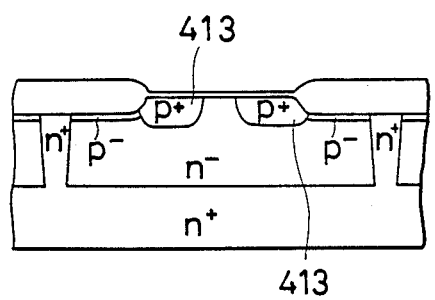

FIGS. 13A to 13D partially illustrate an SIT photosensor in a manufacturing process according to a third embodiment shown in FIG. 11, a structure being shown in which the p-type diffusion layer is provided in the surface region of the epitaxial layer outside the p+ gate region. In FIG. 13A, reference numeral 401 represents an n+ substrate, reference numeral 402 represents an n− epitaxial layer, and reference numeral 403 represents an isolating region. Reference numeral 404 represents a thin oxidized film, and reference numeral 405 represents an Si$_3$N$_4$ film which covers the region where the SIT gate and the source will be formed. Reference numeral 406 represents a resist, and reference numeral 407 represents a $^{11}$B+ ion. By selectively oxidizing with the resist 406 which is removed after the $^{11}$B+ ion 407 has been implanted, a p-type diffusion layer 409 is, as shown in FIG. 13B, formed beneath the thick oxidized film 408. Then, as shown in FIG. 13C, a thin oxidized film 410 is formed again after the Si$_3$N$_4$ film and the thin oxidized film 404 have been removed. Then large dose $^{11}$B+ ion 412 is implanted using the resist pattern 411 as a mask. Then, as shown in FIG. 13D, a p+ gate region 413 is formed by means of thermal diffusion after the resist pattern 411 has been removed. According to this manufacturing method, since high temperature treatment process of selective oxidization and the P+ gate diffusion are conducted for the purpose of forming a p-type diffusion layer 409, the p-type diffusion layer 409 can be diffused for a deep level.

If the density in the p-type diffusion layer 409 is high, a problem arises in that the blue sensitivity deteriorates due to the forming of a non-depleted region in the p-type diffusion layer 409 because of reverse bias between the p+ gate region 413 and the substrate 401 and that between the p+ gate region 413 and the isolating region 403.

Figure 14A:
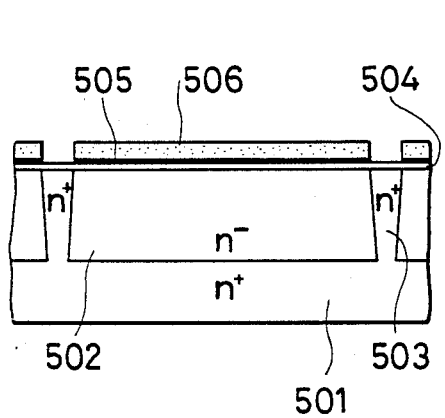
FIGS. 14A to 14D illustrate the manufacturing process according to a fourth embodiment of the present invention.
Figure 14B:
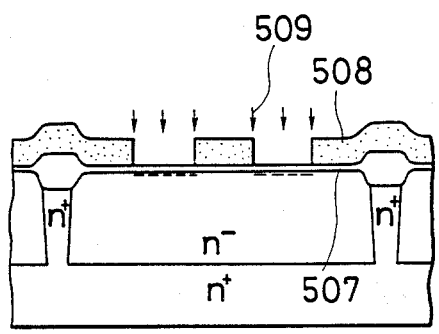
Figure 14C:
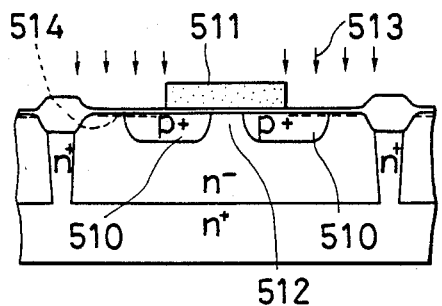
Figure 14D:
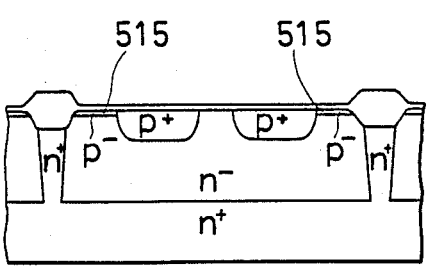

In order to overcome this problem, the manufacturing process of a fourth embodiment, shown in FIGS. 14A to 14D, is one in which the p-type diffusion layer is formed only in the extreme surface region of the epitaxial layer. FIG. 14A illustrates the forming process of Si$_3$N$_4$ pattern 505 before being selective-oxidized, wherein a state is shown in which only the Si$_3$N$_4$ is removed from the isolating region 503. Reference numeral 501 represents an n+ substrate, reference numeral 502 represents an n− epitaxial layer, reference numeral 504 represents a thin oxidized film, and reference numeral 506 represents a resist. The selective oxidization is conducted in this state, and the Si$_3$N$_4$ pattern 505 and the thin oxidized film 504 are removed. Then a thin oxidized film 507 is formed by way of re-oxidization. As shown in FIG. 14B, a resist mask 508 is then formed, and $^{11}$B+ ion 509 is implanted, a p+ gate region 510 then being formed by thermal diffusion. Then, as shown in FIG. 14C, the resist 511 is made to cover the location 512 where the source will be formed and parts of the p+ gate regions 510, and a low dose $^{11}$B+ ion 513 is implanted. By annealing in a furnace or lamp-annealing, a boron-implanted layer 514 is activated, and a shallow p-type layer 515 is, as shown in FIG. 14D, formed. A BF$_2$+ ion may be used for the purpose of obtaining an ever shallower p-type layer. Thanks to the provision of such a shallow p-type layer 515, an SIT photosensor can be obtained in which the blue sensitivity is not substantially deteriorated, no capturing loss of photoelectric charge occurs, and, hence, no residual image is created.

Figure 15A:
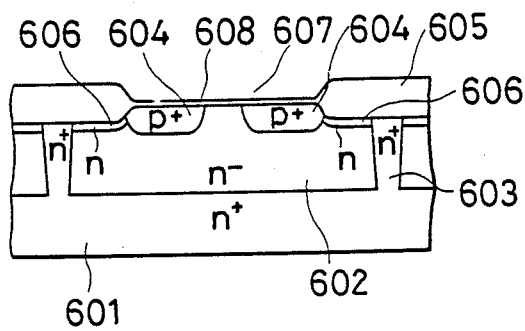
FIGS. 15A and 15B illustrate in cross-section the structure used in the manufacturing process according to a fifth embodiment of the present invention.
Figure 15B:
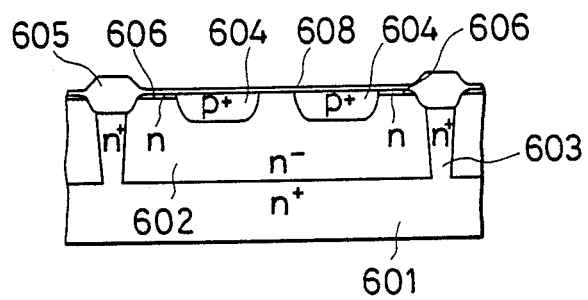
Figure 15C:
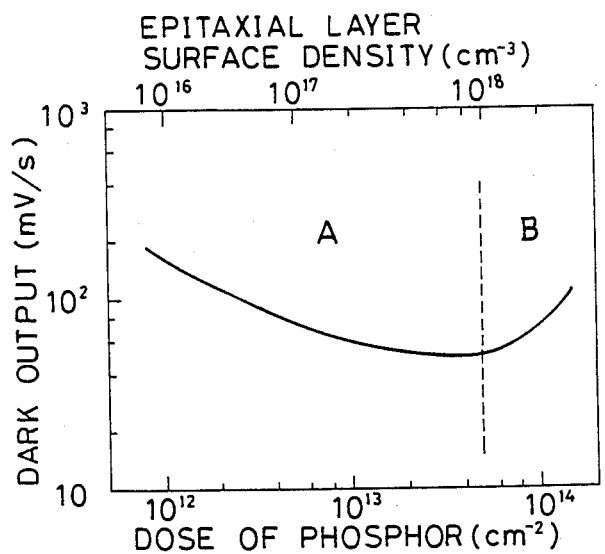
FIG. 15C illustrates the relationship between the ion dose, the density at the surface of the epitaxial layer, and dark output.

FIGS. 15A and 15B illustrate in cross-section the structure of the manufacturing process of a fifth embodiment of the present invention. In this embodiment, by way of shortening a depleted layer which extends along the surface of the epitaxial layer disposed to the outside of the P+ gate region, a thermally-excited charge generated at the surface is lowered for the purpose of restricting the dark output. That is, by ion-implanting a $^{31}$p+ ion or $^{75}$As+ ion into the surface of the epitaxial layer disposed on the outside of the p+ gate region 604, the density at the surface of the epitaxial layer 602 is increased, and an n-type layer 606 is formed. FIG. 15C shows the results of an experiment on the relationship between the dose of the phosphor ion $^{31}$p+, the density at the surface of the epitaxial layer, and the dark output. That is, when the density at the surface of the epitaxial layer is increased by ion-planting on the outside of the gate region by making use of phosphor, the dose and density ($1 \times 10^{17}$ to $1 \times 10^{18}$ cm$^{-3}$) at the surface of the epitaxial layer at which the dark current reaches its lowest level is, as shown in FIG. 15C obtained. In FIG. 15C, in a region A, since the width of the depletion layer which extends to the outside of the gate region is reduced due to the increase in the dose, the dark current is lowered, being generated at the boundary surface between the SiO$_2$ oxidized film and the epitaxial layer. On the other hand, in a region B, when the dose is increased, the dark current is increased because of damage due to ion-implanting, or because of an increase in the reverse leak current due to p+/n+ junction.

FIG. 15A illustrates a case which is similar to the third embodiment shown in FIGS. 13A to 13D, and in which an n-type impurity is ion-implanted before selectively-oxidizing regions other than the place 607 where the SIT gate and source will be formed. Similarly to the fourth embodiment shown in FIGS. 14A to 14D, FIG. 15B illustrates in cross-section a structure in a manufacturing process in which ion-implanting is conducted after the selective oxidization of the SIT and the gate diffusion have been completed. In FIGS. 15A and 15B, reference numeral 601 represents a n+ substrate, reference numeral 603 represents an isolating region, reference numeral 605 represents a thick oxidized film, and reference numeral 608 represents a thin oxidized film. Similarly to the embodiment shown in FIGS. 13A to 13D, and that shown in FIGS. 14A to 14D, the structure shown in FIG. 15B is more suitable for forming a shallow n-type layer.

Figure 15D:
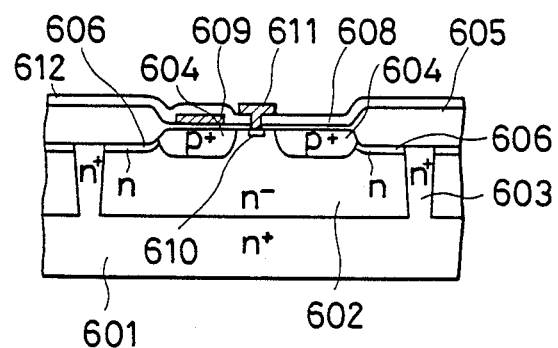
FIGS. 15D and 15E each illustrate in cross-section the structure according to the fifth embodiment of the present invention.
Figure 15E:
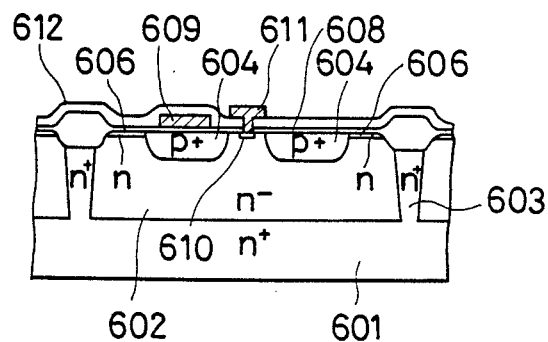

FIGS. 15D and 15E respectively show SITs manufactured by the method shown in the corresponding FIGS. 15A and 15B. In FIGS. 15D and 15E, reference numeral 609 represents a gate electrode, reference numeral 610 represents a source region, reference numeral 611 represents a source electrode, and reference numeral 612 represents an oxidized film.

Figure 16A:
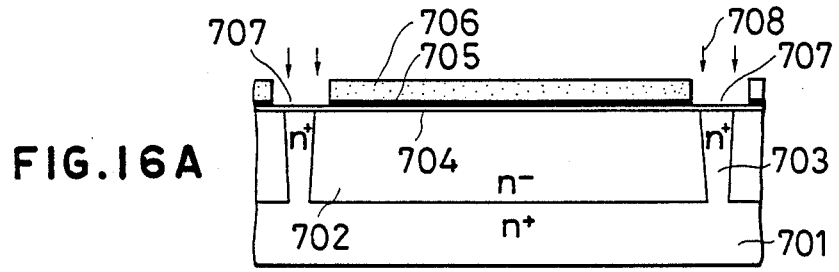
FIGS. 16A to 16D illustrate the manufacturing process according to the sixth embodiment of the present invention.
Figure 16B:
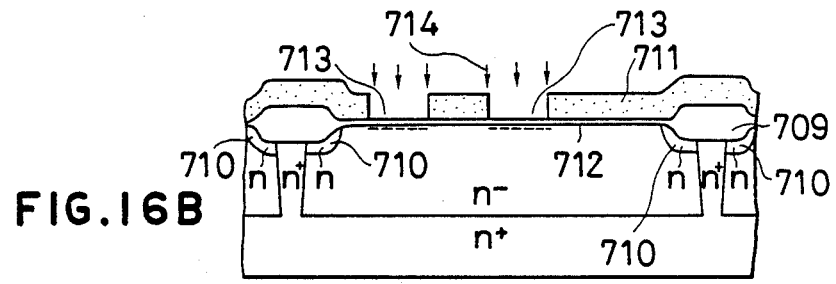
Figure 16C:
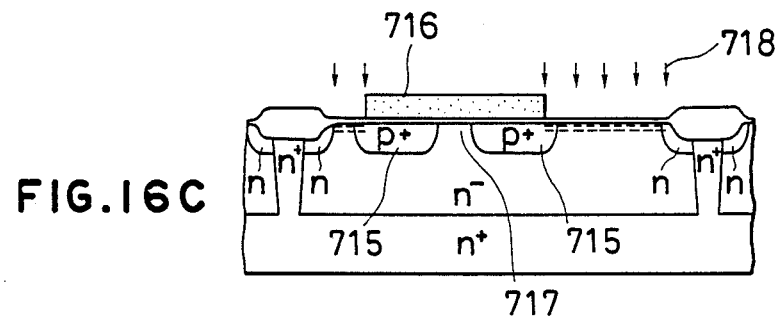
Figure 16D:
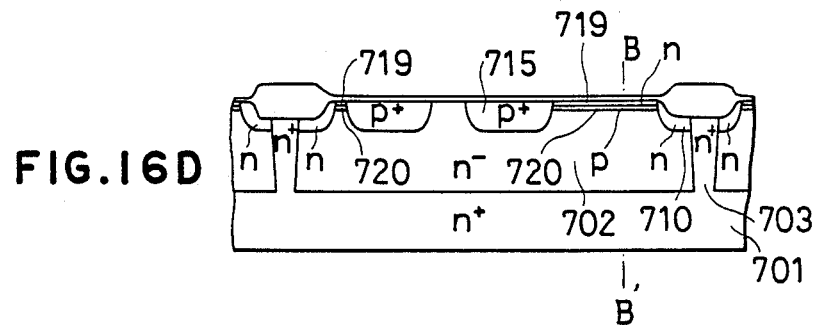

FIGS. 16A to 16D illustrate in cross-section the manufacturing process for SITs according to a sixth embodiment of the present invention in which the third and fourth embodiments shown in FIG. 11, FIGS. 13A to 13D and FIG. 14A to 14D, and the fifth embodiment shown in FIGS. 15A to 15D are combined. In FIG. 16A, reference numeral 701 represents an n+ substrate, reference numeral 702 represents an n− epitaxial layer, and reference numeral 703 represents an isolating region. Reference numeral 704 represents a thin oxidized film, reference numeral 705 represents a Si$_3$N$_4$ pattern in which an SIT field region 707 is bored for the purpose of using it as the wiring region. Reference numeral 706 represents a resist. Using the resist 706 and the Si$_3$N$_4$ pattern 705 as a mask, a $^{31}$p+ ion 708 is ion-implanted, and selective-oxidization is conducted for the purpose of forming a field oxidized film 709. As shown in FIG. 16B, an n-type layer 710 is formed beneath the field oxidized film 709. Then the Si$_3$N$_4$ pattern 705 and the thin oxidized film 704 are removed, and a thin oxidized film 712 is again formed due to thermal oxidation. Then $^{11}$B+ ion 714 is ion-implanted by means of a resist mask 711 at the location 713 where a p+ gate will be formed for the purpose of forming a p+ gate region 715 by way of thermal diffusion. Then, as shown in FIG. 16C, the resist mask 716 is made to cover the location 717 where the source will be formed and parts of the p+ gate region 715 before ion implanting $^{11}$B+ ion and $^{75}$As+ ion 718 and annealing. As a result of this, as shown in FIG. 16D, a double-layer structure comprising a shallow n-type layer 719 and a p-type layer 720 which is formed beneath the former is formed in the surface region of the epitaxial region outside of the p+ gate region 715.

The density of the n-type layer 719 is determined to be high enough to ensure that sufficient voltage resistance with respect to the p+ gate region 715 can be obtained (for example, $1 \times 10^{17}$ to $1 \times 10^{18}$ cm$^{-3}$), and the depth of diffusion is set to be as shallow as possible. On the other hand, the density of the p-type layer 720 is set at a low level such as, $1 \times 10^{14}$ to $1 \times 10^{16}$ cm$^{-3}$. The shallow n-type layer 719 is connected to the n-type layer 710, and is connected to the n+ substrate 701 through the isolating region 703. The extension of the depletion layer from the p+ gate region 715 toward the outer surface is limited by the presence of the shallow n-type layer 719 which causes the density of the surface of the epitaxial layer to become high. Therefore, generation of any thermally exciting charge in this region can be kept to a low level.

Figure 17:
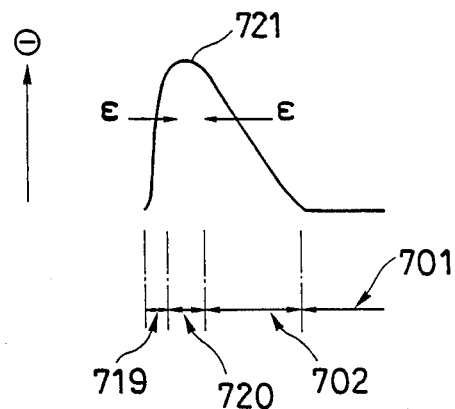
FIG. 17 illustrates potential distribution in the structure shown in FIG. 16D.

The potential distribution during a storage period at the position of a line BB' in FIG. 16D becomes as shown in FIG. 17 since a p-type layer 720 is present. That is, an electric field e toward the p-type layer 720 is present in the epitaxial layer 702 on the outside of the p+ gate region 715. The photo-generated holes are collected without involving any loss by means of this electric field e into the p+ gate region 715 through a hole-capturing portion 721 at which the potential with respect to the holes in the p-type layer 720 is at its lowest. The photo-generated hole moves along a route from an epitaxial bulk to the p+ gate region 715 via the p-type layer 720, or a route from the surface of the epitaxial layer to the p+ gate region 715 via the p-type layer 720. The photo-generated hole is captured in the p-type layer 720 disposed away from the surface, and is moved through the same, whereby the probability of recombination at the surface thus being extremely small.

Figure 16E:
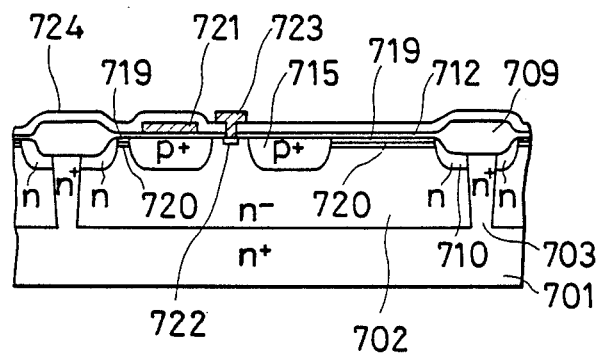
FIG. 16E illustrates in cross-section the structure according to the sixth embodiment of the present invention.

FIG. 16E is a cross-sectional view of an SIT manufactured by the method shown in FIGS. 16A to 16D. In this figure, reference numeral 721 represents a gate electrode, reference numeral 722 represents a source region, reference numeral 723 represents a source electrode, and reference numeral 724 represents an oxidized film.

Figure 8:
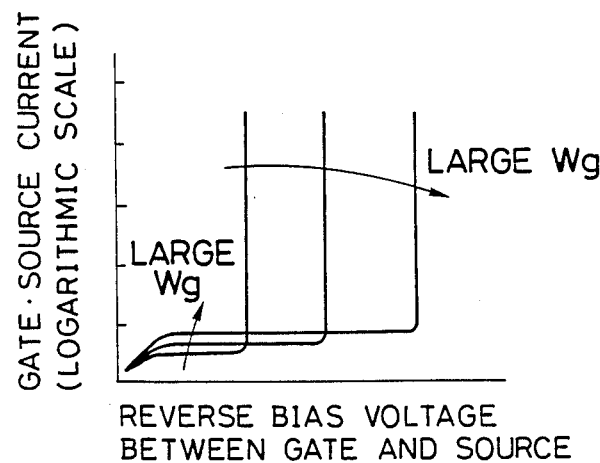
FIG. 8 illustrates the reverse-directional characteristics between the gate and the source of the SIT.
Figure 18:
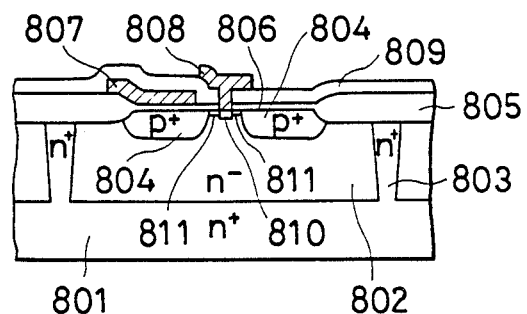
FIG. 18 illustrates in cross-section the structure according to a seventh embodiment of the present invention.

FIG. 18 illustrates in cross-section a structure according to a seventh embodiment of the present invention. This structure is so constituted that the generation of dark output between the p+ gate and source is kept at a low level. As shown in FIG. 8, when the width Wg of the gate is enlarged for the purpose of increasing voltage resistance between the p+ gate and source, the width t of the depletion layer between the p+ gate region and source is also increased. Therefore, the reverse leak current increases. In this embodiment, it is intended that the surface depletion is prevented, and the generation of the thermal exciting charge is thereby reduced by increasing the surface density between the p+ gate and source. That is, the structure is similar to the conventional structure shown in FIG. 1, except that an n-type layer or a p-type layer 811 is formed at a shallower position than the source 810 between the p+ gate region 804 and the source 810. In FIG. 18, reference numeral 801 represents an n+ substrate, reference numeral 802 represents an n− epitaxial layer, reference numeral 803 represents an isolating region, and reference numeral 805 represents a thick oxidized film. Reference numeral 806 represents a thin oxidized film, reference numeral 807 represents a gate electrode, reference numeral 808 represents a source electrode, and reference numeral 809 represents a CVD oxidized film.

Figure 19A:
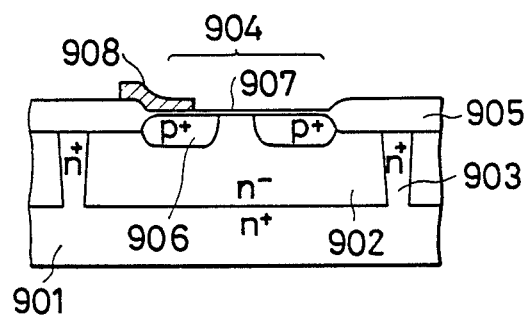
FIGS. 19A to 19C illustrate the manufacturing process according to the embodiment shown in FIG. 18.
Figure 19B:
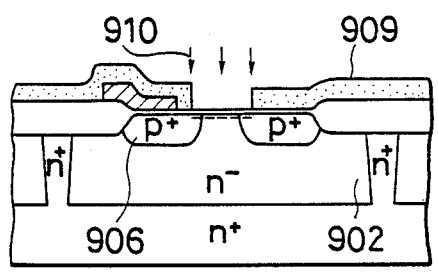
Figure 19C:
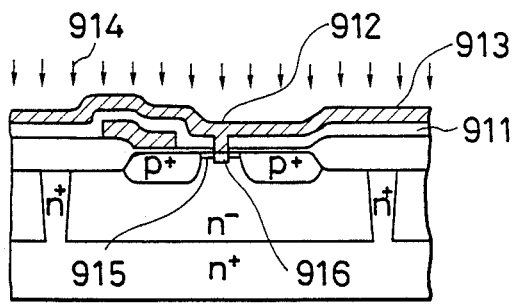

FIGS. 19A to 19C illustrate the manufacturing process of the embodiment shown in FIG. 18. As shown in FIG. 19A, an n− epitaxial layer 902 is formed on an n+ substrate 901. A thick oxidized film 905 is formed in regions other than the place 904 where the source and gate will be formed, the thick oxidized film 905 being formed by way of masking of Si$_3$N$_4$ and selective oxidization after forming an isolating region 903. After the Si$_3$N$_4$ mask and the pad oxidized film have been removed, a thin oxidized film is formed by way of thermal oxidization, and $^{11}$B+ ion is ion-implanted by means of the resist mask at the place where the p+ gate region will be formed so that a p+ gate region 906 is formed by thermal diffusion. Then the thin oxidized film is removed, and the thin oxidized film (gate oxidized film) 907 is again formed by thermal oxidization. Next, a gate electrode 908 is formed in the p+ gate region 906 for the purpose of applying bias, the gate electrode 908 being made of a material such as polysilicone.

As shown in FIG. 19B, a resist mask 909 is then used for the purpose of ion-implanting in the surface region of the n− epitaxial layer on the inside of the p+-gate region 906. In this embodiment, an n-type impurity 910 such as $^{75}$As+ is implanted. Then, as shown in FIG. 19C, the resist mask 909 is removed, a CVD SiO$_2$ 911 is applied for the purpose of insulating each layer, and a SiO₂ 911 in the location 912 where the source will be formed is removed by means of the resist mask. Then polysilicone 913 is accumulated, and $^{31}P^+$ or $^{75}As^+$ 914 is ion-implanted over the entire surface of the accumulated polysilicone 913. The phosphour or arsenic which has been implanted in the polysilicone 913 is activated by annealing at 900° C. for 30 to 60 minutes, and is simultaneously diffused slightly into the location 912 where the source will be formed. In the thermal process for source diffusion, the depth of the n-type diffusion layer 915 of arsenic which has been implanted in the process shown in FIG. 19B is arranged not to exceed the depth of the source diffusion region 916. Then, by forming the pattern of the polisilicone 913, a structure like that shown in FIG. 18 is obtained. Next, the layer-insulating film is accumulated, a contact hole is formed, and Al wire is connected.

The structures according to the first, second, fifth and seventh embodiments shown in FIGS. 9B, 10, FIGS. 15A and 15B, and FIG. 18 can be applied not only to SIT photosensors, but also to the SIT alone, and to a case in which an improvement in the characteristics of SITICs is intended.

As described above with reference to the embodiments, pinch-off voltage can be controlled according to the present invention, by means of an impurity layer formed by ion-implanting at a location immediately beneath the source region. Therefore, the control of pinch-off voltage does not need any change in processing conditions, masks or so on.

Furthermore, by forming various impurity layers by changing the type of impurity, accelerating energy and dose, SITs having optional pinch-off voltages can be easily produced. Furthermore, by forming impurity layers in which the impurity dose is changed, a bipolar transistor can be obtained. As a result of this, SITs and bipolar transistors can be formed using the same mask. Furthermore, control of $h_{FE}$ of bipolar transistors can be performed.

According to the present invention, since an impurity layer of the same type as that of the gate region is formed in the surface region of the epitaxial layer outside of the gate region, an electric field can be formed that substantially covers the entire surface of the epitaxial layer. Therefore, the photoelectric charge generated in the portion close to the surface of the epitaxial layer can be captured in the gate region without involving any loss. As a result of this, the generation of residual images can be effectively prevented.

According to the present invention, since each structure is arranged in such a manner that the density at the surface of the epitaxial layer outside of the gate region is increased by way of forming an impurity layer in the same, the extension of a depletion layer which projects over the gate region is prevented, whereby the thermally excited charge generated in this depletion layer can be reduced, and dark current is restricted too so as to improve the S-N ratio.

According to the present invention, since an impurity layer is formed in the surface region of the epitaxial layer between a gate and a source for the purpose of preventing extension of a depletion layer at the surface between the gate and the source, the amount of a thermally excited charge generated in this depletion layer can be reduced, and dark current is restricted too, allowing the S-N ratio to be improved.

What is claimed is:

1. A vertical static induction transistor in which a first type of high-resistance semiconductor has in a surface region thereof a source region of a first type of diffusion layer, and a gate region which surrounds said source region from at least two directions and said gate region is a second type of diffusion layer which is at a depth in said surface region which is deeper than a depth of said first type of diffusion layer in said source region, said vertical static induction transistor comprising:
   one of a first and a second type of impurity layers, said first type of impurity layer increases the impurity density of said first type of high-resistance semiconductor, and said second type of impurity layer has a maximum density exceeding that of the impurity density of said first type of high-resistance semiconductor, said one of said first and second type of impurity layers being disposed within a region of said first type of high-resistance semiconductor surrounded by said gate region, between (a) a depth which is deeper than a surface of the first type semiconductor but shallower than a depth of said source region and (b) a depth which is deeper than the source region but shallower than a depth of said gate region.

2. A vertical static induction transistor according to claim 1, wherein said first or second type of impurity layer are of ions of an n-type impurity or p-type impurity.

3. A vertical static induction transistor according to claim 1, wherein, when said pinch-off voltage is a first type, said impurity layer is formed by ions of an n-type impurity in an n-channel device.

4. A vertical static induction transistor according to claim 1, wherein, when said pinch-off voltage is a second type, said impurity layer is formed by ions of a p-type impurity in an n-channel device.

5. A vertical static induction transistor comprising:
   a first type of semiconductor substrate;
   a first type of epitaxial layer which forms a channel region, said first type of epitaxial layer being disposed on said substrate;
   a source region of a first type of diffusion layer which is disposed in a surface region of said first type of epitaxial layer;
   a gate region which surrounds said source region from at least two directions, said gate region is a second type of diffusion layer, and is disposed in said surface region of said first type of epitaxial layer;
   one of a first and second type of impurity layers, said first type of impurity layer increases the impurity density of said first type of epitaxial layer, and said second type of impurity layer has a maximum density exceeding that of the impurity density of said first type of epitaxial layer, said one of said first and second type of impurity layers being disposed within a region of said first type of epitaxial layer surrounded by said gate region, between (a) a depth which is deeper than the surface of the first type of epitaxial layer but shallower than a depth of said source region and (b) a depth which is deeper than the source region but shallower than a depth of said gate region;
   an element-isolating region disposed in said first type of epitaxial layer for isolating elements;
   a thin oxidized film disposed over part of said source region and over all of said gate region; and a thick oxidized film which is continuous from said thin oxidized film and which is disposed on said element-isolating region.

6. A vertical static induction transistor, having in a surface region of a first type of high-resistance semiconductor forming a channel region, a source region of a first type of diffusion layer, and a gate region which surrounds said source region from at least two directions, and which is a second type of diffusion layer which is disposed to a depth in said surface region which is deeper than a depth of said first type of diffusion layer in said source region, said vertical static induction transistor comprising:
a second type of impurity layer which is in contact with said gate region in said surface region of said first type of high-resistance semiconductor, said second type of impurity layer being disposed adjacent to said gate region of said second type of diffusion layer on a side of said gate region which is opposite to a side which surrounds the source region.

7. A vertical static induction transistor according to claim 6, wherein said second type of impurity layer is a p-type impurity diffused layer in an n-channel device.

8. A vertical static induction transistor according to claim 7, wherein a density at a surface of said p-type impurity diffused layer forming said second type of impurity layer is a relatively low density of $1 \times 10^{14}$ to $1 \times 10^{16}$ cm$^{-3}$.

9. A vertical static induction transistor comprising:
a first type of semiconductor substrate;
a first type of epitaxial layer, which forms a channel region, disposed on said substrate;
a source region of a first type of diffusion layer, is disposed in a surface region of said first type of epitaxial layer;
a gate region, which surrounds said source region from at least two directions, is a second type of diffusion layer, and is disposed in said surface region of said first type of epitaxial layer;
a second type of impurity layer in contact with said gate region in said surface region of said first type of epitaxial layer and which is disposed adjacent to said gate region on a side of said gate region which is opposite to a side which surrounds the source region;
an element isolating region disposed in said first type of epitaxial layer for isolating elements;
a thin oxidized film disposed over part of said source region and over all of said gate region; and
a thick oxidized film which is continuous from said thin oxidized film, and which is disposed on said isolating region.

10. A vertical static induction transistor, having in a surface region of a first type of high-resistance semiconductor forming a channel region, a source region of a first type of diffusion layer, and a gate region which surrounds said source region from at least two directions, which is a second type of diffusion layer which is disposed at a depth in said surface region which is deeper than a depth of said first type of diffusion layer in said source region;

said vertical static induction transistor comprising:
a first type of impurity layer in contact with said gate region in said surface region of said first type of epitaxial layer and which is disposed adjacent to said gate region on a side of said gate region which is opposite to a side which surrounds the source region.

11. A vertical static induction transistor according to claim 10, wherein said first impurity layer is formed by ions of an n-type impurity in an n-channel device.

12. A vertical static induction transistor according to claim 15, wherein a density of an n-type impurity layer which forms said first type of impurity layer is selected to a high density of $1 \times 10^{17}$ to $1 \times 10^{18}$ cm$^{-3}$.

13. A vertical static induction transistor comprising:
a first type of semiconductor substrate;
a first type of epitaxial layer which forms a channel region on said substrate;
a source region of a first type of diffusion layer disposed in a surface region of said first type of epitaxial layer;
a gate region which surrounds said source region from at least two directions, which is a second type of diffusion layer, and which is disposed in said surface region of said first type of epitaxial layer;
a first type of impurity layer in contact with said gate region in said surface region of said first type of epitaxial layer and which is disposed adjacent to said gate region on a side of said gate region which is opposite to a side which surrounds the source region;
an element isolating region disposed in said epitaxial layer for isolating elements;
a thin oxidized film disposed over part of said source region and over all of said gate region; and
a thick oxidized film which is continuous from said thin oxidized film, and which is disposed on said isolating region.

14. A vertical static induction transistor, having in a surface region of a first type of high-resistance semiconductor forming a channel region, a source region of a first type of diffusion layer, and a gate region which surrounds said source region from at least two directions, and which is a second type of diffusion layer which is disposed to a depth in said surface region which is deeper than a depth of said first type of diffusion layer in said source region, said vertical static induction transistor comprising:
in said surface region of said first type of high-resistance semiconductor outside of said gate region, which is said second type of diffusion layer, a first type of impurity layer contacting said gate region and a second type of impurity layer which is disposed beneath said first type of impurity layer.

15. A vertical static induction transistor according to claim 14, wherein for an n-channel device, said first type of impurity layer is formed by ions of an n-type impurity, while said second type of impurity layer is formed by ions of a p-type impurity.

16. A vertical static induction transistor according to claim 15, wherein a density of an n-type impurity layer which forms said first type of impurity layer is arranged to be a high density of $1 \times 10^{17}$ to $1 \times 10^{18}$ cm$^{-3}$, and a density of a p-type impurity layer which forms said second type of impurity layer is arranged to be a low density of $1 \times 10^{14}$ to $1 \times 10^{16}$ cm$^{-3}$.

17. A vertical static induction transistor according to claim 14, wherein a first type of isolating region is provided for said first type of high-resistance semiconductor for isolating elements, and a first type of diffusion layer is disposed in said surface region of said first type of high-resistance semiconductor in such a manner that said first type of diffusion layer surrounds said isolating region.

18. A vertical static induction transistor comprising:
a first type of semiconductor substrate;
a first type of epitaxial layer which forms a channel region on said substrate;
a source region of a first type of diffusion layer disposed in a surface region of said first type of epitaxial layer;
a gate region which surrounds said source region from at least two directions, which is a second type of diffusion layer, and which is disposed in said surface region of said first type of epitaxial layer;
a first type of impurity layer in contact with said gate region in said surface region of said first type of epitaxial layer outside of said gate region;
a second type of impurity layer disposed beneath said first type of impurity layer in contact with said gate region;
an element isolating region disposed in said first type of epitaxial layer for isolating elements;
a thin oxidized film disposed over part of said source region and over all of said gate region; and
a thick oxidized film which is continuous from said thin oxidized film, and which is disposed on said isolating region.

19. A vertical static induction transistor, having in a surface region of first type of high-resistance semiconductor, a source region of a first type of diffusion layer and a gate region which surrounds said source region from at least two directions, and which is a second type of diffusion layer which is disposed in said surface region of said first type of high resistance semiconductor to a depth in said surface region which is deeper than a depth of said first type of diffusion layer in said source region, said vertical static induction transistor comprising:
a first or second type of impurity layer is disposed at a same depth as or shallower than said source region in said surface region of said first type of high-resistance semiconductor and said first or second type of impurity layer is disposed between said source region of said first type of diffusion layer and said gate region of said second type of diffusion layer.

20. A vertical static induction transistor according to claim 19, wherein said first or second type of impurity layer is formed by ions of an n-type impurity or p-type impurity.

21. A vertical static induction transistor comprising:
a first type of high-resistance semiconductor;
a source region of a first type of diffusion layer which is disposed in a surface region of said first type of high-resistance semiconductor;
a gate region which surrounds said source region from at least two directions, and which is a second type of diffusion layer which is disposed in said surface region of said first type of high-resistance semiconductor at a depth deeper than a depth in said source region;
a first or a second type of impurity layer disposed in said surface region of said first type of high-resistance semiconductor between said source region and said gate region at a same depth as or shallower than said source region;
an element isolating region disposed in said first type of high resistance semiconductor for isolating elements;
a thin oxidized film disposed over part of said source region and over all of said gate region; and
a thick oxidized film which is continuous from said thin oxidized film, and which is disposed on said isolating region.

* * * * *